United States Patent [19]

Geesen et al.

[11] Patent Number: 4,479,255

[45] Date of Patent: Oct. 23, 1984

[54] APPARATUS FOR ACQUIRING AND COLLECTING RADIO SIGNALS COMING FROM A PLURALITY OF STATIONS

[75] Inventors: Michel Geesen, Antony; Jacques Mourant, Maurepas; Daniel P. Ludwig, Ramonville-Saint-Agne, all of France

[73] Assignees: Electronique Marcel Dassault; Centre National d'Etudes Spatiales, both of Paris, France

[21] Appl. No.: 318,542

[22] Filed: Nov. 5, 1981

Related U.S. Application Data

[63] Continuation-in-part of Ser. No. 38,748, May 14, 1979, and a continuation-in-part of Ser. No. 166,621, Jul. 7, 1980, , which is a continuation-in-part of Ser. No. 38,770, May 14, 1979.

[30] Foreign Application Priority Data

May 16, 1978 [FR] France .................... 78 14339
May 17, 1978 [FR] France .................... 78 14626

[51] Int. Cl.³ .................... H04B 1/16; H04B 17/00
[52] U.S. Cl. .................... 455/246; 455/226
[58] Field of Search .............. 455/234, 239, 245, 246, 455/136, 138, 226, 12, 52; 375/98

[56] References Cited

U.S. PATENT DOCUMENTS 3,042,800  7/1962  Gluth .................... 375/98
4,225,976  9/1980  Osborne et al. .................... 455/226

OTHER PUBLICATIONS

"Decision Directed Automatic Gain Control'-'-NASA's Jet Propulsion Laboratory Spring 1979, NASA Tech. Briefs, p. 10.

Primary Examiner—Marc E. Bookbinder
Attorney, Agent, or Firm—Pollock, Vande Sande & Priddy

[57] ABSTRACT

An apparatus for acquiring and collecting messages aboard a satellite which are transmitted via respective radio-signals over different frequencies from a plurality of beacons comprises a receiver having an adjustable gain control input. An automatic gain control loop is provided for maintaining the gain of the receiver at a constant value. While the input frequencies of each input signals and time of arrival thereof are not exactly known, it is known that all these input frequencies are contained within a predetermined input frequency band which is periodically scanned by a frequency analyzer. This analyzer operates by scanning the center frequency of a band pass filter over the input frequency band and detecting the level of signals at the output of this filter for a plurality of successive frequencies within this input frequency band. The detected levels are digitized. The resulting digitized level indications are statistically analyzed and the result of this statistical analysis is used for adjusting the level of the gain control input of the receiver. According to an embodiment, only those detected levels which correspond substantially to input signals carrying messages retained for demodulation are used for determining an average level indication over a time period such as that for a full revolution of the satellite. The thus determined average level is compared with a reference value to adjust the receiver gain, thus eliminating gain variations due, for example, to aging of the components.

20 Claims, 6 Drawing Figures

APPARATUS FOR ACQUIRING AND COLLECTING RADIO SIGNALS COMING FROM A PLURALITY OF STATIONS

This application is a continuation-in-part of application Ser. No. 038,748, filed May 14, 1979; and a continuation-in-part Ser. No. 166,621, filed July 7, 1980; which is a continuation-in-part application of Ser. No. 038,770; filed May 14, 1979.

FIELD OF THE INVENTION

The invention relates to apparatus adapted for acquiring messages received at different frequencies for example from a plurality of stations and for processing these messages with a veiw to extracting the information they contain.

Such apparatus may have use in a transmission installation which comprises a plurality of beacons distributed in a territory and transmitting messages in digital language by phase modulation of a carrier wave, these messages being adapted to be collected by an apparatus carried by a satellite moving above the territory either for storing the received signals in a memory or for retransmitting the same.

The messages transmitted by the various beacons reach the satellite in a random or asynchronous manner and the frequency of their carrier waves (which is typically in the order of several MHz) is unknown so that the apparatus comprises frequency analysis means for scanning a predetermined frequency band inside which it is known that the transmitted carrier wave frequencies are contained, and at least one processing device having a phase locked loop for performing the demodulation of the message or messages selected in the course of the spectrum analysis.

SUMMARY OF THE INVENTION

The present invention relates to improvements in such an apparatus which permit a simple and economical construction with high efficiency to be attained.

One object of the invention is to provide means for maintaining a constant value of the gain of the receiver which has an advantageous application in the case of a receiver carried by a satellite intended to gather and process signals coming from a plurality of beacons distributed in a territory over which the satellite moves.

The invention aims at overcoming here the phenomena of aging and has application in the case where measurements of signal level have an importance for the frequency analysis and for the processing of messages.

According to an embodiment the levels of signals which are demodulated by the processing apparatus which the equipment of the satellite includes may be transmitted to the ground, and in case of variation from the average level of the transmitted signals a telecontrol causes the gain of the receiver to vary to maintain it at a constant value to amplify all the signals it receives with the same gain whatever their intensities are.

According to another embodiment, digital indications of the levels of the signals which are demodulated by the processing apparatus or approximations thereof are averaged. This averaged value is then directly used aboard the satellite to control the gain of the receiver.

According to another embodiment, the satellite comprises means for generating a constant level reference signal and applying it to the input of the receiver for controlling the gain thereof with the corresponding signal resulting form the amplification furnished by the receiver.

Another mode of performance calls upon thermal noise, and according to this mode the gain of the receiver is corrected according to the level of the amplified thermal noise.

In this respect an operating step is provided during which the receiver processes thermal noise to the exclusion of a signal received from the exterior.

According to still another mode of performance, level information is furnished by the spectrum analyser and said information is used and subjected to statistical processing with a view to the comparison with previously calculated values or values resulting from prior information.

Such an embodiment is particularly interesting when the handling used furnished level date in digital values.

BRIEF DESCRIPTION OF THE DRAWINGS

In the description which follows, given by way of example, the accompanying drawings are referred to, in which.

DESCRIPTION OF EMBODIMENTS

Figure 1:
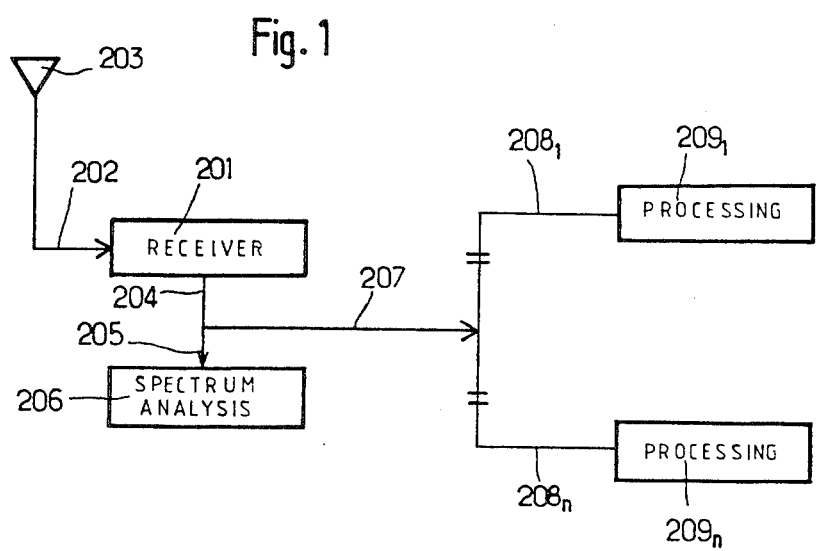
FIG. 1 is a circuit block diagram of apparatus for receiving and processing radio signals received from a plurality of stations.

A radio receiver 201 (FIG. 1), intended to furnish signals to a spectrum analyzer and processing devices, has an input 202 to which are applied signals picked up by an antenna 203. Its output 204 is divided into two branches, one 205 which constitutes the input of a device 206 for measuring the level and frequency of signals received and the other 207 starting from which are branched parallel path $208_1 \ldots 208_n$ ending at processing devices $209_1 \ldots 209_n$ for demodulating the received signals.

Figure 2:
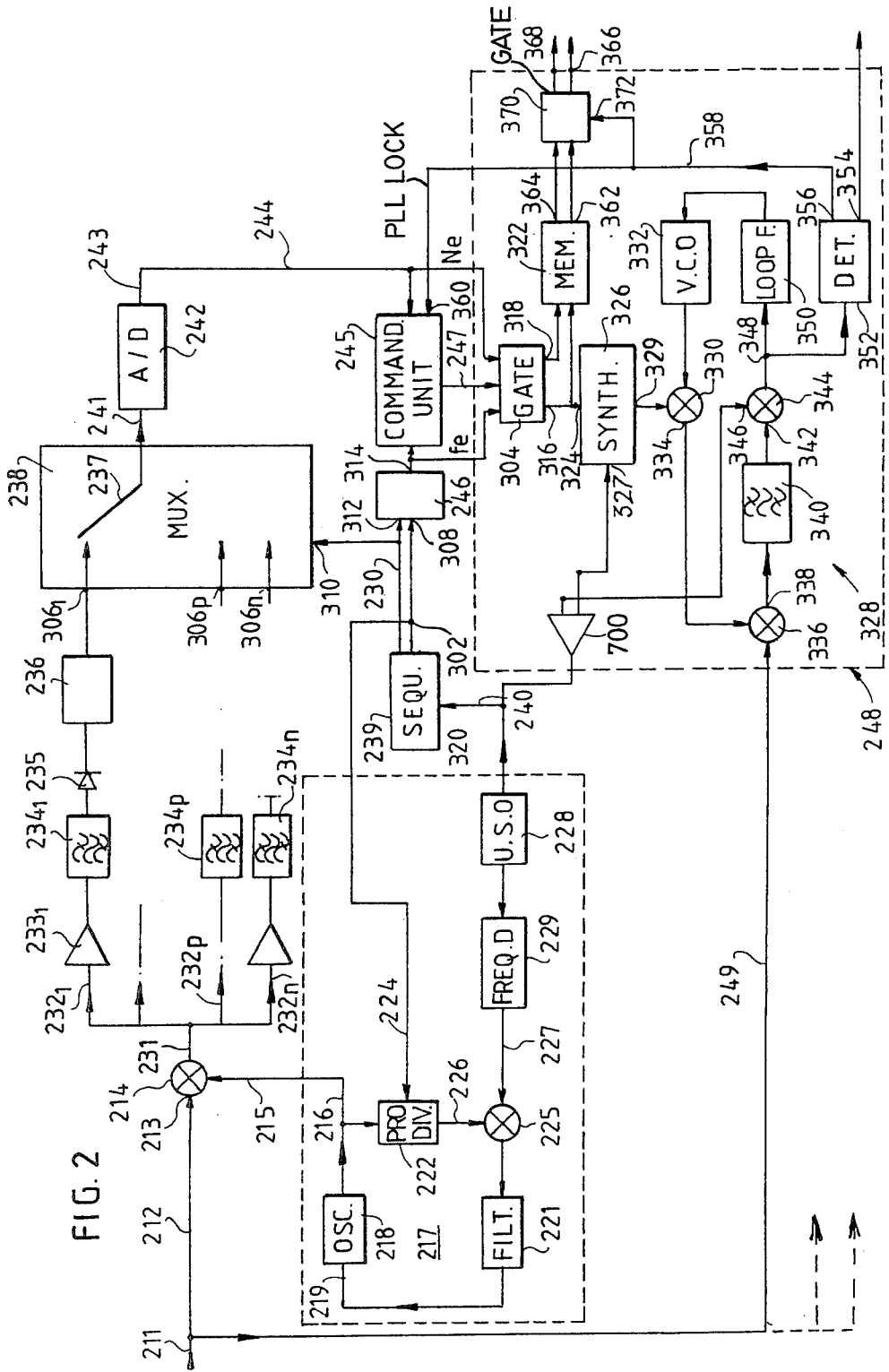
FIG. 2 is a block diagram of a portion of a circuit such as that of FIG. 1 for analyzing the frequency of the received signal.

Reference is now made to FIG. 2. The signals coming from a radio receiver, such as 201, reach input 211 which is applied by a line 212 to the input 213 of a mixer 214. The second input 215 of this mixer is connected by a line 216 to the output of oscillator 218 in a phase locked loop 217 comprising oscillator 218, the frequency of which is controlled by voltage applied by a phase comparator 225 to its input 219, via a band pass filter 221, and a frequency divider 222 programmable by narrow increments under the action of a programming control line 224. The loop 217 also comprises the phase comparator 225 whose input 226 coupled to the output of programmable divider 222, is part of the loop and whose other input 227 applies to the phase comparator 225 an ultrastable frequency furnished by an ultrastable oscillator 228 via a frequency divider 229 introducing a fixed division factor.

The fast repetitive frequency scanning of the VCO 218 output is controlled by the programmable divider 222 whose programming input is cycled step by step over a predetermined range of digital values.

Because of the closed loop control afforded by phase locked loop 217, the value of the frequency applied to the input 215 of the mixer 214 does not depend on the conditions of aging of the VCO 218, and the accuracy is that of the ultrastable oscillator 228.

The output 231 of the mixer 214 may be divided into a number of band pass filtering paths or channels $232_1 \ldots 232_n$ in each of which an amplifier 233 feeds a band pass filter 234, the number of paths, and therefore the number of filters, depending on the width of the frequency band scanned by the synthesizer compared with the entire width of the spectrum to be scanned at the output of receiver 201.

The output of each filter 234 is coupled via a detector 235 to a filter 236 the output of which is connected to a respective sample input 306 of a multiplexer 238 (switch 237) controlled by a line 230 out of a sequencer or timing circuit 239 connected by a line 240 to the ultrastable oscillator 228. The line 241 connected at the output of multiplexer 238 forms the input of an analog/digital converter 242 whose output 243 is applied by a line 244 to a command unit 245 also connected to the sequencer 239 via a frequency evaluation circuit 246.

At the output 247 of the command unit 245 are present in succession couples of values of level N and frequency F which constitute the information sought by scanning the spectrum.

This information may be used for adjusting at any moment the frequency of a processing device 248 for demodulating a signal among signals which may be present on input 211 which are routed by a line 249 to this processing device 248.

It has been established that instead of using a VCXO type piezo-electric oscillator requiring a command coming from a digital/analog converter and being part of an open loop as a frequency scanning oscillator, a frequency synthesizer may be employed, including a closed loop comprising a VCO type oscillator, that is to say, non-piezo-electric, as has just been described with which, all things being equal, the scanning speed may be considerably increased in a ratio ranging from 1 to 4.

It is also possible to thus assure the scanning of a wider range of frequencies by calling upon a frequency synthesizer and not an open-loop local oscillator.

Preferably, signals received from the beacons each include a pure carrier wave portion which is unmodulated and is followed by a modulated, typically phase modulated, portion containing the particular message or data to be collected by the satellite from the respective beacon.

In operation, (FIG. 2), the synthesizer 217 is controlled by the programming input 224 of its programmable divider 222, so as to sweep a frequency band $\Delta f_m$. Thus, $\Delta f_m$ is the frequency excursion of the local oscillator signal on input 215 of mixer 214.

The programming input 224 is controlled via output 302 of sequencer 239. This output 302 is progressively and repeatedly incremented step by step over a given range of control values so as to produce a digital control signal for programmable divider, each step corresponding for example to 100 Hz on input 215 at the output of the synthesizer 217. If, for example, the output 320 cycles over 256 steps, the corresponding frequency excursion of signals on input 215 will be 25 kHz.

The output signal of the mixer 214 has a frequency corresponding to the difference between any frequency signal at the input 211 of the circuit of FIG. 2 (i.e. corresponding to output 204 of a receiver 201 of FIG. 1) and that of input 215.

This differential frequency on output 231 of mixer 214 is simultaneously applied to the n filtering channels $232_1$ to $232_n$.

The center frequencies of the band pass filters $234_1$ to $234_n$ are respectively $f_{c1}, \ldots f_{cn}$, each being offset with respect to the next by $\Delta f_m$. Consequently, if an input signal having a frequency $f_r$ is present within the input signal frequency bandwidth, the respective differential frequency on output 231 will be passed by a filter $234_p$ having center frequency $f_{cp}$, when the local oscillator frequency 215 reaches a value of $\Delta f = f_r - f_{cp}$. In practice, as the local oscillator signal on line 215 varies, the output signal level of band pass filter $234_p$ increases and reaches its maximum value when $f_r - f_{cp} = \Delta f$ and then starts decreasing.

Accordingly, the input signal frequency spectrum which may be analysed by the frequency spectrum analyser constituted by synthesizer 217, mixer 214 and filter channels $232_1$ to $232_n$ has a bandwidth of $n \times \Delta f_m$. During each sweep cycle of the frequency synthesizer output 216 over its respective range $\Delta f_m$, any input signal within such spectrum will be detected by one of filter channels $232_1$ to $232_n$.

The outputs of the filtering channels may be sequentially connected by means of multiplexer 238 to analog/digital converter 242, so as to convert the respective analog level sample value at the channel output into a corresponding digital value. The values at the output 243 of A/D converter 242 are supplied via a line 244 to command unit 245 and to a gate 304 in processing unit 248, as will be explained hereinafter.

The switching rate of multiplexer 238 is so selected that during the duration of the increasing then decreasing signal level at the output of any filter channel $232_p$ corresponding to an input frequency $f_r$, several samples of the respective signal levels are sampled and digitized.

To each one of these samples levels at input $306_p$ of multiplexer 238 corresponds a respective $\Delta f_i$ value at the output of frequency synthesizer 217, which itself depends from the input 224 on programmable divider 222. The latter input value is available at the output 302 of sequencer 239. This output is coupled to an input 308 of circuit 246.

The multiplexer 238 is controlled also by sequencer 239 via line 230 which applies to its input 310 the coded address of the particular filtering channel $232_1$ to $232_n$ (input $306_1$ to $306_n$) which must be interrogated at each instant. This coded address is received on input 312 of the circuit 246 which, by an adding operation, delivers on its output 314 at each instant a digital indication of a range in which the frequency of the received signal lies within the input frequency band, which corresponds to the level sampled and digitized by A/D converter 242.

This frequency range indications on output 314 is basically equal to $f_{cp} + \Delta f_i$ where $\Delta f_i$ is the instantaneous frequency output value of frequency synthesizer 217 as represented by the digital indication on its programming input 234. It is applied to a command unit 245 as well as to gate 304 at the input of processing unit 248.

Accordingly, for each frequency programming step during one sweep cycle of the frequency synthesizer 217, a frequency estimate, or range, value $f_e$ may be associated to the respective level value $N_e$, both values being supplied to command unit 245 and to the gates 304 of each processing device 248.

The sequencer 239 is a conventional combination of counters which are supplied by pulses from the ultrastable oscillator 228 to provide sweep cycle control signals on its output 302 and coded control addresses for operating multiplexer 238 on line 230.

A frequency divider 700 is coupled at the output of the ultrastable oscillator 228. It performs the frequency division of the oscillator 228 by several constant factor to deliver respective accurate reference frequency signals to each processing unit 248 as will be described later.

Figure 3:
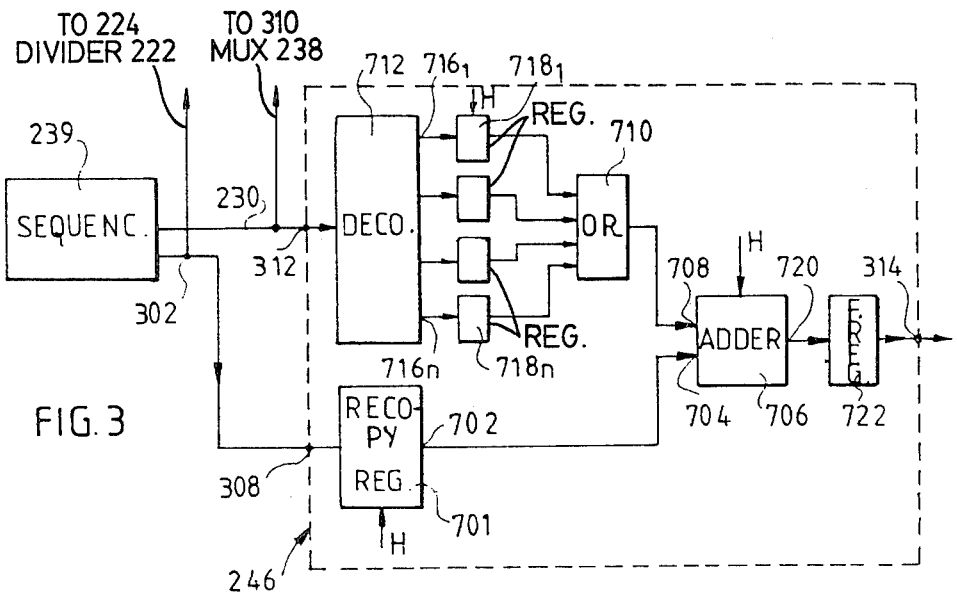
FIG. 3 is a block diagram of a frequency estimate indicating circuit.

FIG. 3 depicts a schematic embodiment of frequency range indication circuit 246. A recopy register 701 is connected at the multi-bit input 308 of the circuit 246 to store a digital indication of each synthesizer input programming value. Output 702 of register 701 is coupled to one input 704 of an adder 706 whose other input 708 is coupled at the output of an OR gate 710. A decoder circuit 712 is coupled to a multi-bit input 312 of circuit 246 which receives the address control signals of multiplexer 238. The decoder 712 has n outputs $716_1$ to $716_n$, each coupled to the input of the respective register $718_1$ to $718_n$. These registers are loaded with counts which correspond to the center frequencies of band pass filters $234_1$ to $234_n$. The output of each one of these registers is coupled to a respective input of OR circuit 710. Each register is controlled for readout by clock signals such as H shown for register $718_1$. Accordingly, if decoder output $716_1$, for example, is energized, the content of respective register $718_1$ will be read out of the input 708 of adder 706 via OR circuit 710 upon receipt of the H timing signal.

At the same time, the H timing signal also triggers the readout of the content of recopy register 701 to input 704 of adder 706 to deliver to an output 720 of this adder a signal which is stored in a frequency register 722 whose output forms the output 314 of circuit 246 and delivers the frequency range for each multiplexer 238 addressing position.

Operation of the processing unit 248 (FIG. 2) will now be described. Upon receipt of an authorization signal on line 247 from command unit 245 (which will be derived as explained hereinafter), the frequency range $f_e$ and the respective digitized level values $N_e$ are passed by gate 304 (outputs 316 and 318 respectively) to a memory 322. Also, the frequency range $f_e$ at the output of 316 of gate 304 is fed to the frequency programming input 324 of a frequency synthesizer 326 which operates to initially set the operating frequency of processing device 248 to the respective frequency range. From this value, a phase locked loop 328 operates to attempt to lock itself to a respective frequency signal present on line 249 at the input of processing unit 248. Line 249 is directly connected to input 211 (output 204 of FIG. 1).

Briefly summarized, synthesizer 326 whose input 327 receives a reference frequency from divider 700 converts the digital indication of its input 324 into an oscillating signal of respective frequency on its output 329, which is passed to a mixer which receives also the output signal of a voltage controlled oscillator 322. The differential signal at the output 334 of mixer 330 is applied to one input of a mixer 336 which receives on its second input the signals on line 249. Output 338 of mixer 336 is coupled to a narrow band pass filter 340 having an accurately determined center frequency to apply its resulting output signal on input 342 of a phase comparator 344 receiving on its second input 346 a reference frequency signal out of divider 700. Output 348 of mixer 344 controls via a loop filter 350 the voltage control input of VCO 332 thus completing the phase locked loop 328.

When the loop 328 is locked on a signal on input 249, a substantially DC signal on output 348 appears which corresponds to the phase modulation, if any, of the input signal and is passed to a detecting circuit 352 having one output 354 which is the data-output of the device 348 and a second output 356 which is connected via line 358 to an input 360 of command unit 245 thereby signalling that phase locked loop 328 is locked on an input signal.

As indicated before, several parallel connected processing units 248 identically arranged may be provided. The command unit 245 which is not part of this invention, is a logical circuit which may be for example operative for detecting when the digitized signals out of each filtering channels $232_1$ to $232_n$ go through a maximum level $N_{max}$. If such a signal is detected for example in input $306_p$, a respective authorization signal is sent on line 247 to each processing unit 248 whose phase lock indication on output 356, as received on input 360 of command unit 245, indicates that the respective unit is available, i.e. not locked on a particular input signal. Upon receiving such signal, gate 304 passes the respective value $N_{pmax}$ and respective frequency range $f_{pe}$ to memory 322. The frequency estimate is also applied for setting the frequency of synthesizer 326 to a value which is by necessity close to that of the input signals on line 249 from which such frequency range is originated in the spectrum analysis apparatus. In order to prevent identical couples $N_{pmax}$ and $f_{pe}$ to be assigned to different processing devices 248, a predetermined hierarchy is established between them in the command unit so that when one of these couples is assigned to an available processing unit, it may not be assigned to any other.

Memory 322 of each processing unit 248 has two outputs, respectively 362 and 364 for the frequency range and the maximum level, respectively, which are connected to outputs 366 and 368 of this processing unit via a gate 370 whose control input 372 is connected to phase lock indication line 358. Accordingly, the content of memory 322 may only be transmitted to a telemetry conditioning unit, not shown, when the respective processing unit has locked on a given input signal for processing the same.

Figure 4:
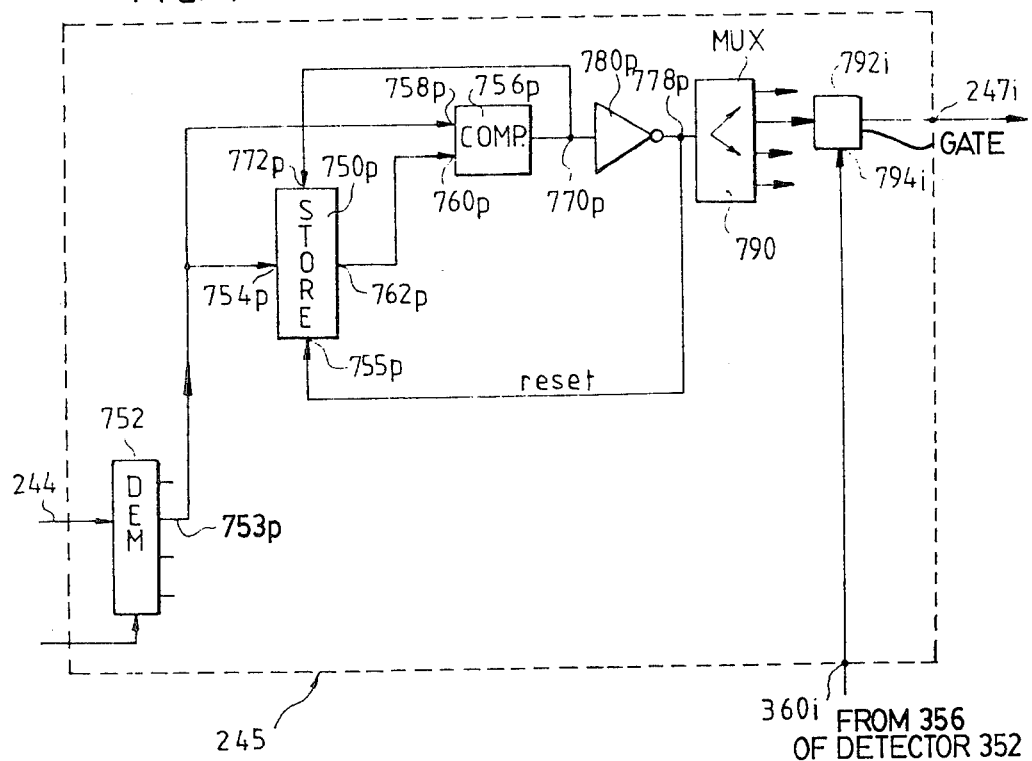
FIG. 4 is a schematic block diagram of a command unit such as represented in FIG. 2.

A simplified embodiment of a command unit 245 is depicted by FIG. 4.

Each digital level indication from a respective filtering channel $232_p$ reaching input 244 of command unit 245 is addressed by a demultiplexer 752, via respective output $754_p$ to input $754_p$ of a digital store $750_p$ and to an input $758_p$ of a digital comparator $756_p$. The other input $760_p$ of comparator $756_p$ is coupled at the output $762_p$ of store $750_p$.

For each new digital level indication, the circuit operates in two steps. First, the new level indication on output $754_p$ is compared to the content of store $750_p$ which is normally the last level indication acquired from the respective filter channel $232_p$. If the new level is greater than the stored level, a signal at the output $770_p$ of comparator $760_p$ enables input $772_p$ of store $750_p$ to store the new value on input $754_p$ in place of the previously stored value.

In the opposite situation where the last stored value was greater than the newly acquired level value, no signal is present at the output $770_p$ of comparator $756_p$.

This in turn produces a signal on output $778_p$ of an inverter $780_p$ coupled to this output $770_p$, which is operative to perform two functions:

First, via a multiplexer circuit 790, it sends a control signal sequentially to each one of a plurality of gates 792, there being provided one gate $792_i$ for each processing unit $248_i$. Each gate $792_i$ is controlled by the signal on input $360_i$ indicating that the respective processing unit $248_i$ is not already phase locked (see FIG. 2, output 356 of detecting circuit 352). If gate $792_i$ is enabled by this authorization on its input $794_i$, the control signal out of multiplexer 790 is transmitted on line $247_i$ to gate $304_i$ of respective processing unit $248_i$ (see FIG. 2).

The signal at output $778_p$ is also effective to send a reset signal on reset input $755_p$ of the store $750_p$ so as to erase the previous level indication from this store.

Accordingly, the command unit 245 operates to watch the signal levels at the output of each filtering channels $232_1$ to $232_n$ and to determine the maximum of each series of levels corresponding to an input signal of respective frequency among the radio signal received. An authorization is then produced for an available processing unit $248_i$ (i.e. not locked on another input signal), to acquire the respective maximum level $N_e$ and frequency estimate $f_e$ via gate 304.

It will be recognized by the man skilled in the art that the command unit may be implemented by the use of appropriate combination of hardware circuits or by a programmed microprocessor or other programmable device to effect proper allocation of frequency estimate and respective associated level values to the processing unit.

In an example, the input frequency band to be scanned is 25 kHz. The frequency synthesizer produces a sweep signal 215 having an excursion of 25 kHz which is incremented by steps of 100 Hz.

As indicated before, each beacon signal received comprises an unmodulated portion followed by a phase modulated portion. The unmodulated or pure carrier wave portion is intended for the detection of the arrival of such message and the preparation of a respective processing unit for receiving and demodulating the following modulated portion. It will be understood that the unmodulated portion must be at least as long as the sweep cycle duration. Accordingly, the faster of the scanning speed of the input frequency spread band, the shorter the unmodulated portion of each of the beacon signals may be. Moreover, the shorter this unmodulated portion, the shorter the average overall time during which each processing unit will be busy and, consequently, the fewer processing units such as 248 have to be provided for receiving a maximum number of simultaneous signals as the satellite overflies the beacons in any one part of its revolution.

It has been found that by using such a frequency synthesizer for generating the sweep frequency a wide input frequency band may be swept quite fast while keeping accurate track of the sweep frequency value.

Specifically, if a frequency synthesizer is used to sweep a frequency band of 25 kHz instead of an other type of variable oscillator such as a VCXO having typically a 6.25 kHz frequency excursion, the number of filtering channels needed at the output of the frequency analysis mixer 214 is one, instead of four, to scan the input frequency spread band of 25 kHz. Accordingly, the amount of filtering hardware required is diminished. However, if one wishes to maintain the same overall input frequency band sweeping time for example 80 milliseconds, the frequency synthesizer sweep speed must be four times greater than that of the other type of variable oscillators such as a VCXO.

Accordingly, if the frequency synthesizer programming input sweeps 25 kHz by steps of 100 Hz in 80 milliseconds, each digital frequency indication on the programming input 224 will stay about 300 microseconds.

When the indication on the programming input 224 switches from one value to the next, the synthesizer loop 217 operates to vary the frequency of signal on mixer input 215 to reach the new value posted on its programming input. However, this adjustment requires a time interval which is not negligible when compared to the total 300 $\mu$s time during which the programming value is posted. Typically, the time constant of the synthesizer loop 217 may be between 30 and 100 microseconds. Assuming the latter value for example, at the end of the dwell time of a given programming value on input 224, the synthesizer output signal frequency will be within 1% of the programmed value. The actual synthesizer output frequency thus varies throughout this dwell time interval, fast at the beginning thereof and increasingly more slowly thereafter.

This is an unconventional way of operating a frequency synthesizer, which is normally used for the accurate frequency positioning of the output signal which it provides, after the output frequency has stabilized.

In the instant case, by reason of the high scanning speed required, the frequency applied to the mixer 214 is variable during each 300 microseconds step and its average value is not accurately represented by the synthesizer programming input value. This lack of accuracy is referred to here as the lagging error of the synthesizer. It has been found however that, within the framework of the particular application herein contemplated, such error is acceptable for providing frequency estimates corresponding to the detected levels, in order to control a quick adaptation of each processing device to the frequency of a respective detected input signal.

In addition, it has been found that despite such lagging error, results were as good as or better than with other types of variable frequency oscillators, for example VCXO's, which are controlled by an analog signal, and this even though such oscillators operate at a lesser speed on narrower frequency excursion range.

Errors due to drift of the VCXO because of aging or other factors affecting an oscillator controlled in an open loop are eliminated. The error in determining the frequency estimate for each level value is substantially smaller than 100 Hz and as good or better than that obtained with a VCXO operating under the conditions previously described, which may typically be about ±80 Hz taking into account inevitable various sources of noise.

These results are achieved with a simple frequency analysis device including only one band pass filtering channel for a 25 KHz input signal frequency spread band. A wider band, for example a 100 KHz wide frequency band, may be scanned by using in accordance with the invention the previous frequency synthesizer (25 KHz excursion) with four band pass filtering channels $232_1$ to $232_4$ at the output of mixer 214, having staged center frequencies at 25 KHz from each other. Thus, less filtering hardware than with a conventional variable oscillator is required and errors resulting from uncertainties in the exact values of the center frequencies of the respective band pass filters are fewer, or, alternatively, for a given amount of hardware a much wider input frequency band may be scanned which sufficient speed.

Figure 5:
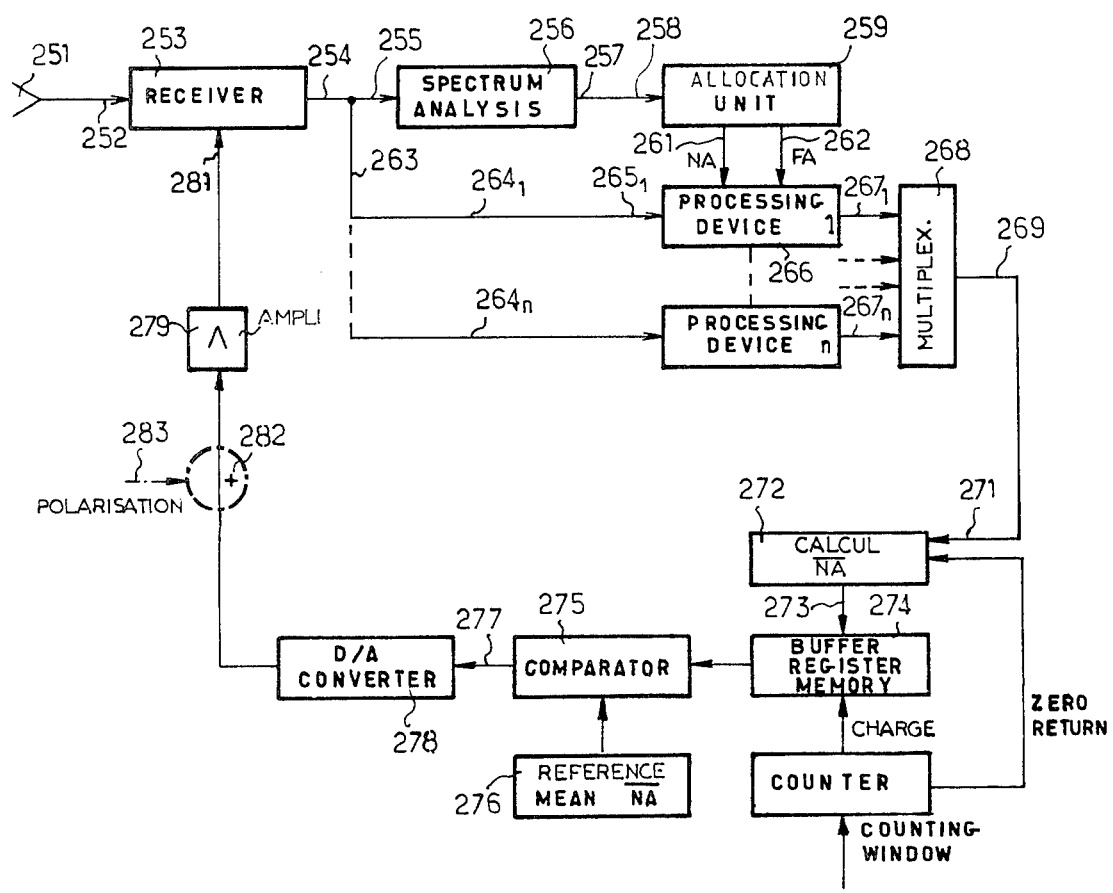
FIG. 5 is a circuit block diagram of a receiver gain control-circuit embodiment for apparatus such as shown in FIG. 1.

In the level and frequency measuring apparatus shown in FIG. 5 the signals picked up by the antenna 251 similar to antenna 203 are applied to the input 252 of a receiver 253 similar to receiver 201. The output 254 of the receiver which corresponds to output 204 (FIG. 1) or output 211 (FIG. 2) is connected to the input 255 of spectrum analysis apparatus 256 whose output 257 is connected to the input 258 of an allocation unit 259. Frequency spectrum analysis apparatus 256 is typically constituted with a frequency synthesizer such as 217 (FIG. 2) a mixer 214 and filter channels $232_1$ to $232_n$, while frequency allocation unit 295 may comprise, with reference also to FIG. 2, a multiplexer 238, a converter 242, command unit 245 and combination circuit 246 to furnish, at its output 261, level information, and at its output 262, frequency information (FIG. 5). A branch line 263 of the output 254 of the receiver 253 divides into a certain number of paths $264_1 \ldots 264_n$ comparable to line 249 of FIG. 2, each of which ends at the input 265 of a processing device 266. Such processing device may be constructed in an analogous manner to processing unit 248 of FIG. 2 and the outputs $267_1 \ldots 267_n$ of said devices are analogous to the level output 368 of processing unit 248 and terminate for regrouping the information in multiplexer 268. The output 269 of said device is connected to the input 271 of a calculating device 272 which delivers to its output 273 an "allocated average level" or $\overline{NA}$ which corresponds to the average of m processed messages. The average value is transferred to a buffer register or memory 274 and the average values of the following messages m are calculated. The value stored in the memory is compared in a comparator 275 with an average value of the allocated reference level furnished by a device 276. The result of the comparison present at the output 277 of comparator 275, is processed by a digital/analog converter 278 and after amplification in an amplifier 279 is introduced at the input 281 of the receiver 253 for control of the gain of this receiver, to maintain it a constant level.

Besides the converter 278 and the amplifier 279, an adder device 282 permits by application to its input 283 of a polarizing voltage, the performance of tests.

Figure 6:
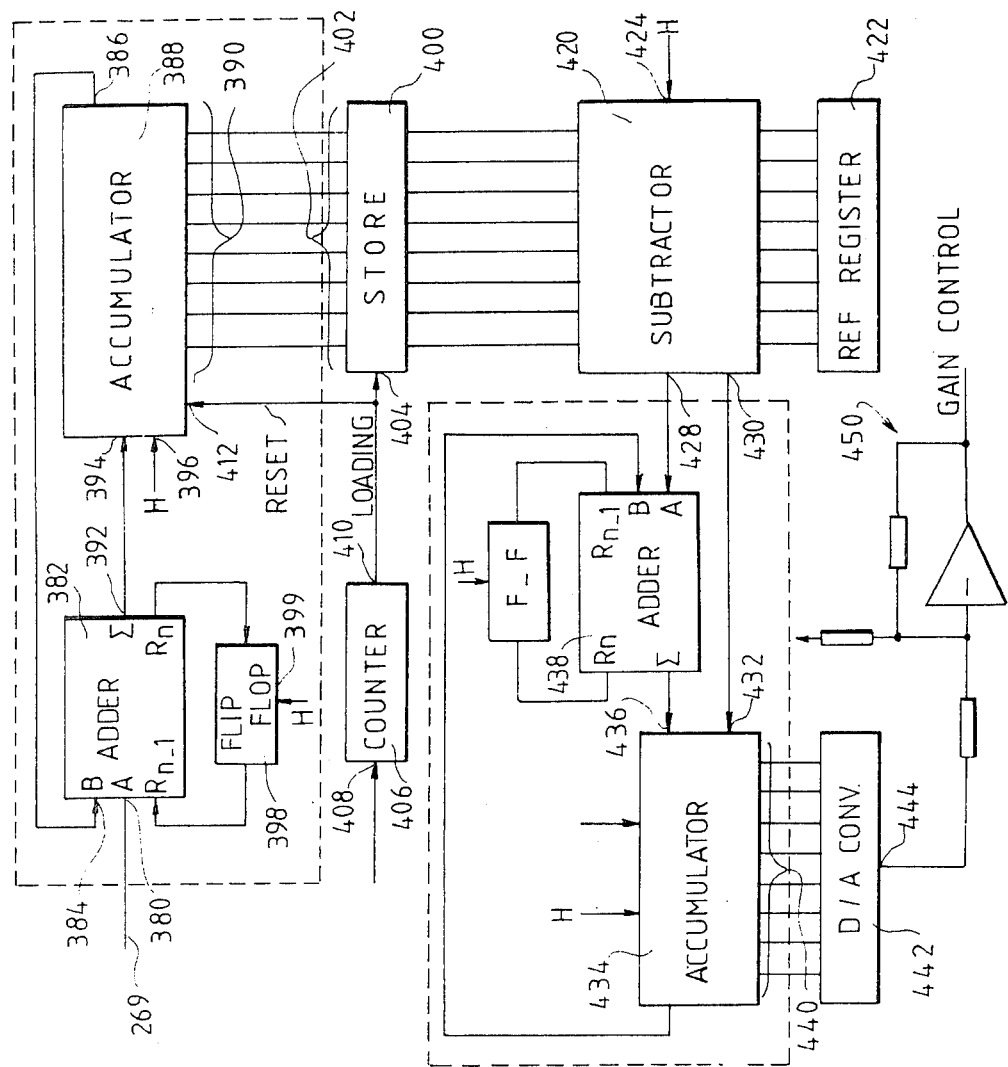
FIG. 6 is a block diagram of one portion of the circuits of FIG. 5.

FIG. 6 depicts in greater detail the implementation of the input gain control device which is schematically shown on FIG. 5. Digital indications of level at the output of processing devices $267_1$ to $267_n$ appear sequentially on the output 269 of multiplexer 268. The levels are, for example, the levels associated with the frequency range from which the respective processing devices have locked themselves on a respective input signal within the input frequency band. The digital level indications are transmitted to an input 380 of serial adder 382 having a second input 384 for receiving the signal from output 386 of an accumulator 388 having a plurality of parallel outputs 390. The serial output 392 of adder 382 is connected to the serial input 394 of accumulator 388 which also has a clock input 396. A flip-flop 398 is feed back connected between an output $R_n$ and input $R_{n-1}$ of adder 382 and clocked by its input 399 for the carry over.

Parallel outputs 390 corresponding to a preselected number, for example 8, of most significant digits of the count in accumulator 388 are connected to respective inputs 402 of a store 400.

The store control input 404 of this store 400 is controlled by a Binary counter 406 which input 408 is activated to increment the counter by one each time a new level value appears on input 380 of adder 382. The output 410 of counter 406 produces an activation signal after a predetermined count has been reached, for example 256, or 1024, corresponding to the receiving and processing of a respective number of beacon signals. The output signal of the counter 410 is used to reset accumulator 388 by its input 412 after the content of its most significant digits has been transferred to store memory 400. If, for example, the accumulator content is to be transferred into store 400 every 256 level readings, the accumulator 388 has no parallel output coupled to register 400 for the eight least significant digits so as to transfer to store 400 a count which is representative of the average value of the 256 level indications received, i.e. the accumulated value divided by 256.

This stored value is subtracted by circuit 420 from a programmable reference number in a store 422 which represents an average reference value for maintaining the gain of the receiver at a constant value. Subtraction is made serially under control of a clock signal on input 424. The subtractor has a data output 428 and a sign output 430. The latter is connected to a sign input 432 of an accumulator 434 which receives on its count input 436 signals from a serial adder 438 similar to adder 382 and connected to accumulator 434 in a manner similar to the connection between accumulator 388 and adder 382. The parallel outputs 440 of accumulator 434 are converted into an analog signal by digital to analog converter 442 which produces on its outputs 444 a gain control signal applied to gain control input 281 of receiver 253 (FIG. 5) via an amplifier 450. Thus, each time a new average count is loaded into store 400, it is compared with the reference average count is loaded into store 400, it is compared with the reference average level. The resulting value is added or subtracted, according to its sign, to a digital gain setting value in accumulator 434, so as to modify the analog voltage controlling the gain of receiver 253.

Thus, an embodiment has been described where an average value of the level indications of the signals processed by the processing units is computed after a predetermined number of signals has been received. It is also possible to slightly modify the circuit of FIG. 6 to provide for a computation of average after a predetermined period of time has elapsed or in response to a given control signal. In this case, the count in level indication counter 406 is used as an input to a divider for dividing the count in accumulator 388 by such number, the result being loaded into a memory register such as 400.

In particular, the selected time period for the computation of the average level may be that of one revolution of the satellite.

It has been found that the signal levels transmitted by the beacons and received by the satellite vary within a range which may be typically of 10 db, for all the beacons which may be overflown by a satellite during one data collecting revolution. The respective average signal levels at the satellite remain well within 1 db. This is the case, in particular, because of the quite large number of signals which are received by the satellite during such a revolution.

Interestingly, the temperature of the circuits of a collecting station aboard a satellite undergoes very little variation during a revolution. Moreover, such a temperature remains very nearly constant from one revolution to the next. As a result, no short term variations of the receiver gain have to be expected within a revolution of the satellite or over a relatively small number of revolutions. However, such gain is bound to vary with other phenomenon, such as aging affecting the behaviour of the receiver. This gain variation due to aging is quite effectively checked and compensated by the computation of average values of signals which are picked up at the satellite.

As described in the previous embodiment, the average signal level value is that of signals effectively demodulated by the processing units or devices. An alternative embodiment involves a statistical treatment not only of the levels of signals actually processed but of any signal levels acquired at the output of the frequency analysis system. This provides an average signal value which differs somewhat from and is slightly lower than the value considered in the previous example. Of course, the reference level value which is used for example in store 422 is selected in accordance with the method used for selecting the levels which are statistically analyzed.

In a collecting station aboard a satellite such as described, telemetry means are provided for retransmitting to a ground station the data collected. This data includes information about the frequency of each processed signal and its level. In addition, it has been seen that a signal acquisition technique is used which relies on an analysis of signal levels. It is therefore important that the gain of the receiver and essentially of the entire data acquiring and processing unit be essentially maintained constant, so as to have an effective measure of levels for achieving the various ends which have been discussed.

An advantage of the afore-mentioned technique is that an effective gain control is achieved in a very simple manner with very little amount of specific equipment therefor. Indeed, whether the levels used are those at the output of the frequency analyzer or those of the signals effectively processed, digital indications of such levels are available for other purposes. Such purposes include the analysis of levels for the allocation of the range frequencies of received signals, as well as the transmission of the levels of signals processed back to earth.

Accordingly, this technique is particularly suitable when the gain control technique must remain effective over a longer period of time without possibility of direct intervention, such as is the case aboard a satellite.

We claim:

1. Apparatus for acquiring messages transmitted by radio signal from a plurality of radio beacons and providing AGC control, comprising:
   means for receiving radio signals from said beacons, said receiving means having an adjustable gain control;
   means for detecting and processing said radio signals received by said receiving means, including means for producing at least an approximate indication of the level of each of said radio signals;
   means for performing a statistical analysis of said level indications; and
   means for deriving from said statistical analysis a gain control signal to be applied to said receiving means to maintain the gain of said receiving means at a predetermined level over an extended period of time.

2. Apparatus according to claim 1, wherein said level indications are produced in a digital from.

3. The apparatus of claim 1 wherein said statistical analysis means is operative for providing an indication of average of said digital level indications and said deriving means comprises means for comparing said average level indication with a reference level indication to produce said gain control signal.

4. The apparatus of claim 3, wherein said average level indication is computed over a predetermined number of digital signal level indications.

5. The apparatus of claim 3, wherein said average level indication is computed over a predetermined time period during which signals are received by said satellite from said beacons.

6. The apparatus of claim 5, wherein said time period is that of a revolution of said satellite.

7. Apparatus for acquiring messages transmitted from a plurality of stations by means of respective radio signals over different frequencies and providing AGC control, comprising:
   means having an adjustable gain control input for receiving said respective radio signals over different frequencies and producing corresponding output electrical signals whose amplitudes depend on the gain of said receiving means;
   means for processing said respective radio signals, comprising means for producing level measurements related to the amplitude level of said respective radio signals received over said different frequences;
   means for performing a statistical analysis of said amplitude level indications; and
   means for deriving from said statistical analysis a gain control signal to be applied to said receiving means gain control input for maintaining said gain at a constant value.

8. Apparatus according to claim 7, wherein said level measurements are in digital form.

9. Apparatus according to claim 7, wherein said level measurement means comprises means for frequency analyzing said output signals and means for determining the level of signals obtained at the output of said frequency analysis means.

10. Apparatus for receiving a plurality of messages at a receiving station transmitted from a respective plurality of transmitting stations by a respective plurality of radio signals of a respective plurality of frequencies and providing AGC control comprising:
    a gain controlled receiving means for receiving said plurality of signals, said gain controlled means providing as an output said signals at a level determined by a signal applied to a gain control input;
    heterodyne mixer means coupled to said receiving means for responding to said gain controlled output signals;
    frequency and amplitude determining means connected to said heterodyne mixer means, said frequency and amplitude determining means including a frequency scanning means for generating a plurality of stepped local oscillator frequency signals for heterodyning with said gain controlled output signals to produce heterodyned radio frequency signals, frequency range determining means connected to said frequency scanning means to provide a frequency range indication of each radio signal, and amplitude measuring means responsive to said heterodyne mixer means to provide digital signals representing the respective amplitude of each of said heterodyned radio frequency signals;

means for performing a statistical analysis of said digital signals representing said amplitude levels and generating a gain control signal representing the result of said analysis; and means for coupling said control signal to said gain control input whereby said gain controlled receiving means produces level controlled radio frequency signals at a constant amplitude level.

11. The apparatus of claim 10 wherein said means for performing statistical analysis provides an indication of an average level of said digital signals representing said levels and said means for coupling comprises means for comparing said average level indications with a reference level indication to produce said gain control signal.

12. The apparatus of claim 11, wherein said average level indication is computed over a predetermined number of digital signals representing said levels.

13. The apparatus of claim 11, wherein said average level indication is computed over a predetermined time period during which signals are received at said receiving apparatus.

14. The apparatus of claim 13, wherein said receiving apparatus is mounted aboard an earth satellite and said predetermined period is at least equal to a revolution period of said satellite.

15. The apparatus of claim 10 wherein said statistical analysis is performed on selected digital signals representing signal amplitudes corresponding to radio signal frequency ranges provided by said frequency range determining means.

16. The apparatus of claim 15 wherein said frequency and amplitude determining means further includes a frequency tunable signal processing means connected to receive said gain controlled output radio signals, and tuned to a frequency under control of said frequency range determining means; and said statistical analysis means receives a signal indicative of an amplitude level of a signal lying within said determined frequency range.

17. The apparatus of claim 16, further comprising a plurality of frequency tunable signal processing means for simultaneously processing a plurality of input signals.

18. The apparatus of claim 10 wherein said amplitude measuring means includes band pass filter means for receiving said heterodyned signals, means for measuring the amplitude of signals produced by said band pass filter means at successive time intervals, and means for digitizing said levels.

19. In a satellite receiving station having a receiver for receiving a plurality of beacon radio signals at different frequencies, an apparatus for providing amplitude control for said received beacon radio signals comprising:

a gain controlled radio frequency amplifier for receiving said beacon radio signals and providing said signals at an amplitude selectively controlled by a gain control input signal;

means for generating a plurality of sequential frequency stepped local oscillator signals over a frequency bandwidth occupied by said radio signals;

means for mixing said local oscillator signals with said radio signals;

a plurality of filters connected to receive an intermediate frequency signal from said means for mixing, each of said filters occupying a different portion of the bandwidth occupied by mixed signals from said means for mixing;

multiplex means for alternately sampling the output of said filters;

means synchronized with said multiplex means for generating a frequency range signal representing a sampled filter which passes a bandwidth portion of said mixed signals, and the magnitude of said filter passed signal;

means for statistically analyzing each of said signal magnitudes over a period to time whereby an average signal level is derived; and means for supplying a control signal to said gain controlled radio frequency amplifier proportional to said average signal level whereby the amplitude level of said radio frequency amplifier is controlled.

20. The apparatus of claim 19 wherein said means for statistically analyzing comprises:

means for generating an average reference level;

means for averaging said magnitude levels; and means for comparing said average reference level with an average of said magnitude levels to produce an error signal for controlling said gain controlled amplifier.

* * * * *